United States Patent [19]
Foerstner et al.

[11] Patent Number: 5,164,326
[45] Date of Patent: Nov. 17, 1992

[54] COMPLEMENTARY BIPOLAR AND CMOS ON SOI

[75] Inventors: Juergen A. Foerstner, Mesa; Bor-Yuan Hwang; John E. Schmiesing, both of Tempe, all of Ariz.

[73] Assignee: Motorola, Inc., Schaumburg, Ill.

[21] Appl. No.: 860,794

[22] Filed: Mar. 30, 1992

[51] Int. Cl.⁵ .......................................... H01L 21/265
[52] U.S. Cl. ........................................ 437/34; 437/57; 437/59; 437/21; 148/DIG. 150
[58] Field of Search ................... 437/34, 59, 920, 57, 437/21, 62; 148/DIG. 9, DIG. 150

[56] References Cited

U.S. PATENT DOCUMENTS

| | | | |
|---|---|---|---|
| 4,777,147 | 10/1988 | Scott et al. | 437/57 |
| 4,868,135 | 9/1989 | Ogura et al. | 437/34 |
| 4,988,638 | 1/1991 | Huang et al. | 437/57 |
| 5,024,965 | 6/1991 | Chang et al. | 437/57 |
| 5,102,809 | 4/1992 | Eklund et al. | 437/59 |

Primary Examiner—Brian E. Hearn
Assistant Examiner—Tuan Nguyen
Attorney, Agent, or Firm—Joe E. Barbee

[57] ABSTRACT

A method for fabricating BiCMOS on SOI. An SOI wafer (14) with an oxide layer (17) and a nitride layer (16) has areas isolated by a LOCOS or mesa isolation (13). A region (15) is defined for CMOS structures from which the insulating layers (17,16) are removed. A gate oxide (21), a polycrystalline silicon layer (22), and a second insulating layer (23,24) is formed. A region for emitters (26) is defined and nitride deposited to form a spacer (27). An oxide layer (28) is grown over the polycrystalline silicon (22) within the emitter region (26). The wafer (14) is etched to the underlying monocrystalline silicon (18) forming base contacts (31). A polycrystalline silicon spacer (36) is formed from a second polycrystalline layer (43) and an oxide spacer (40) is deposited. A region for bipolar collectors (32) and CMOS areas (34) is defined and a spacer (38) deposited.

10 Claims, 4 Drawing Sheets

COMPLEMENTARY BIPOLAR AND CMOS ON SOI

BACKGROUND OF THE INVENTION

The present invention relates, in general, to semiconductor structures, and more particularly to a silicon on insulator structure having both complementary bipolar and CMOS devices.

One of the fundamental parameters of integrated circuit manufacture is the electrical isolation which is provided between the different devices which comprise the integrated circuit. Typically a reversed biased semiconductor junction has been utilized for this purpose. However, it has long been recognized that isolation using a high quality insulating material such as silicon dioxide, greatly enhances the performance of integrated circuits in just about every way. For example, integrated circuits intended for military applications which must operate in the presence of ionizing radiation typically use some form of silicon on insulator (SOI). Numerous methods of fabricating such SOI integrated circuits have been used in the past, including methods such as separation by oxygen implantation or SIMOX. More recently bonded wafer methods have produced a silicon film having a low defect density, but with poor control of thickness of the silicon film above the oxide.

The prior art includes numerous methods for fabricating transistors in bulk silicon which utilize a vertically oriented structure. While vertical structures are suitable to bulk silicon, they are difficult to fabricate in a very thin film. In addition such structures do not take advantage of the low parasitic potential of thin film SOI. A method for fabricating a horizontal bipolar transistor on an SOI substrate was described in the paper "A Thin-Base Lateral Bipolar Transistor Fabricated on Bonded SOI", by N. Higaki et al., 1991 VLSI symposium technical digest, pages 53 to 54, which is incorporated herein by reference. This method allows for fabrication of bipolar transistors on an SOI substrate, however the method of fabrication produces a long thin base area with electrical contact provided only at either end of the base structure. The resultant high base resistance degrades the device performance, reducing achievable bandwidth, noise, and switching speed. Another method for fabricating a horizontal bipolar transistor on an SOI substrate was presented in the paper "A NOVEL HIGH-PERFORMANCE LATERAL BIPOLAR ON SOI" by G. G. Shahidi et al., 1991 IEDM, pp 26.1.1-26-1.4. This method addresses the base resistance problem, but requires added process complexity to form a polycrystalline silicon spacer on only one side of the base opening.

There is a need for a method for fabricating both complementary bipolar and CMOS (BiCMOS) transistors using an SOI method which allows a much simplified lateral isolation between devices. The method should utilize a horizontal structure so as to minimize parasitic effects, especially base resistance. Ideally, the method should use the minimum number of mask steps, fabricate self-aligned transistors and should integrate fabrication of both complementary bipolar and CMOS transistors into a single manufacturing flow requiring a minimum of extra steps devoted solely to one transistor type.

SUMMARY OF THE INVENTION

Briefly stated, the present invention provides a method for fabricating both complementary bipolar and CMOS transistors on SOI. The method comprises providing a wafer having a thin film of monocrystalline silicon on an oxide layer divided into a plurality of fabrication areas by vertical oxide isolation regions. A layer of oxide is grown over the thin film of monocrystalline silicon. Further depositing a layer of nitride over the layer of oxide. Defining a region where CMOS structures are desired then removing the layer of oxide and the layer of nitride from that region. Growing a gate oxide, depositing a layer of polycrystalline silicon, a layer of nitride and a layer of oxide. Defining a region for emitters, etching the region and depositing nitride to form a nitride spacer. Growing an oxide layer over the polycrystalline silicon within the emitter region. Etching the nitride and a slot in the polycrystalline silicon to the underlying monocrystalline silicon using the oxide layer as a mask so as to form base contacts for the bipolar transistors. Depositing a polycrystalline silicon spacer and a spacer of oxide. Defining a region for bipolar collectors and CMOS gate areas and depositing a nitride spacer.

DETAILED DESCRIPTION OF THE DRAWINGS

FIGS. 1-9 show highly enlarged cross sectional views of a portion of a semiconductor structure which embodies the present invention during various stages of processing. For clarity the cross sectional views show two parts of a complete wafer which illustrate a bipolar and a CMOS structure which may be fabricated using a preferred embodiment of the present invention. The left side of FIGS. 1-9 illustrate a preferred method to fabricate a bipolar transistor. Both complementary NPN and PNP bipolar transistors may be fabricated using the steps illustrated by use of the appropriate N type and P type doping. The right side of FIGS. 1-9 illustrate the same preferred method to fabricate a CMOS transistor. Complementary MOS transistors, both P channel and N channel, may be fabricated using the steps illustrated by starting with the N type or P type material.

Figure 1:
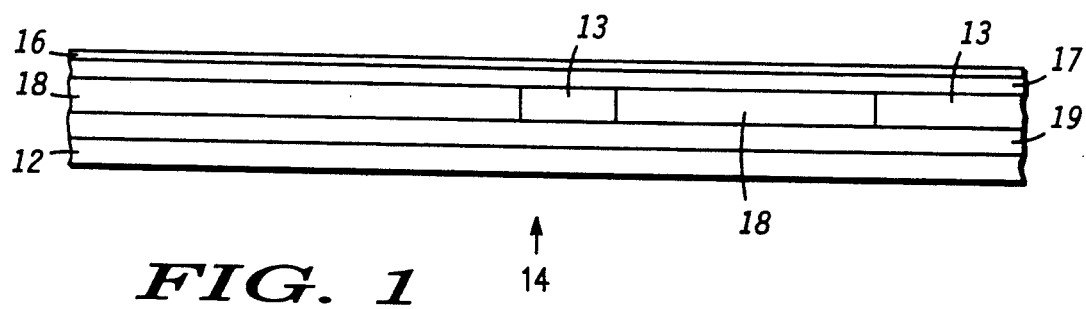
FIG. 1 shows a highly enlarged cross sectional view of a portion of an SOI starting wafer.

FIG. 1 shows a starting wafer 14 comprising a thin film 18 of monocrystalline silicon on an oxide layer 19. Starting wafer 14 is a silicon on insulator wafer (SOI) which is typically fabricated by the SIMOX method or by a bonded wafer method. A bonded wafer fabrication method suitable for the preferred embodiment of the present invention provides a thin film of silicon with extremely good control of the film thickness. Such a method is described in a co-pending U.S. patent application Ser. No. 07/751,001, "Silicon Film With Improved Thickness Control", by J. Foerstner et al., filed 28 Aug., 1991, assigned to the same assignee as the present application, and which is incorporated herein by reference. Using this wafer fabrication method, starting wafer 14 will be supported by a handle wafer 12 positioned beneath oxide layer 19. Handle wafer 12 serves only as a support for starting wafer 14 and is not changed by this embodiment of the present invention, hence handle wafer 12 is shown only in FIG. 1.

Above thin film 18 an oxide layer 17 is grown, followed by deposition of a nitride layer 16 over oxide layer 17. Both oxide layer 17 and nitride layer 16 extend over the entire wafer. Thin film 18 is typically fabricated having a thickness of between 1,000 Angstroms and 25,000 Angstroms. Thin film 18 is doped as either N type material or P type material. Typically both N type and P type material will be used in a plurality of selected areas of thin film 18 which are isolated from each other by a local oxidation of silicon (LOCOS) method forming a LOCOS isolation 13 through thin film 18. LOCOS isolation 13 is typically fabricated by photolithographic definition followed by growth of an oxide, such as silicon dioxide, using methods well known in the art. Due to the nature of a thin film, the lateral encroachment of oxide or implanted dopants beyond the desired area is extremely small. Typical lateral oxide encroachment is as small as 500 Angstroms using a very thin film such as thin film 18. Alternative embodiments replace LOCOS isolation 13 with a mesa isolation. The mesa isolation comprises removal of thin film 18 from the selected areas by methods well known in the art. This leaves an isolated mesa formed from the remaining thin film 18. Typically the cavity formed by removal of selected areas of thin film 18 is subsequently filled with an insulating material.

Figure 2:
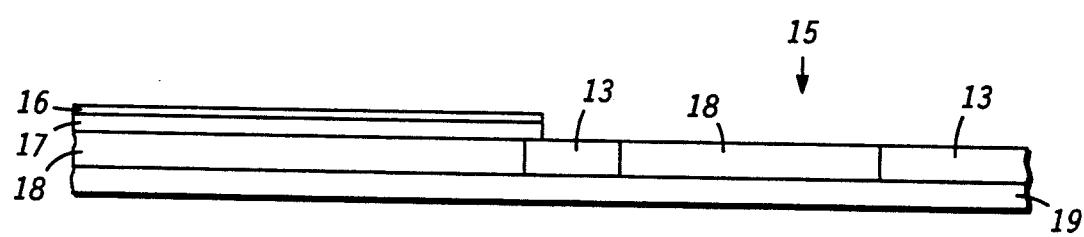
FIG. 2 shows the wafer of FIG. 1 after a CMOS region is defined.
Figure 3:
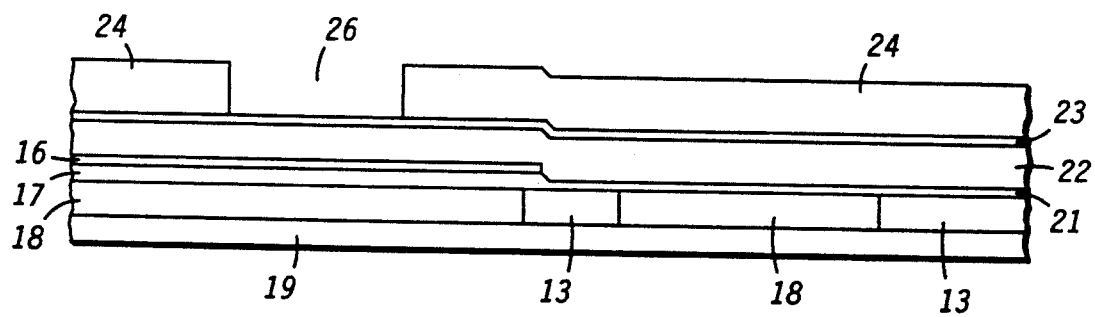
FIG. 3 shows the wafer of FIG. 2 after an emitter area is defined.
Figure 4:
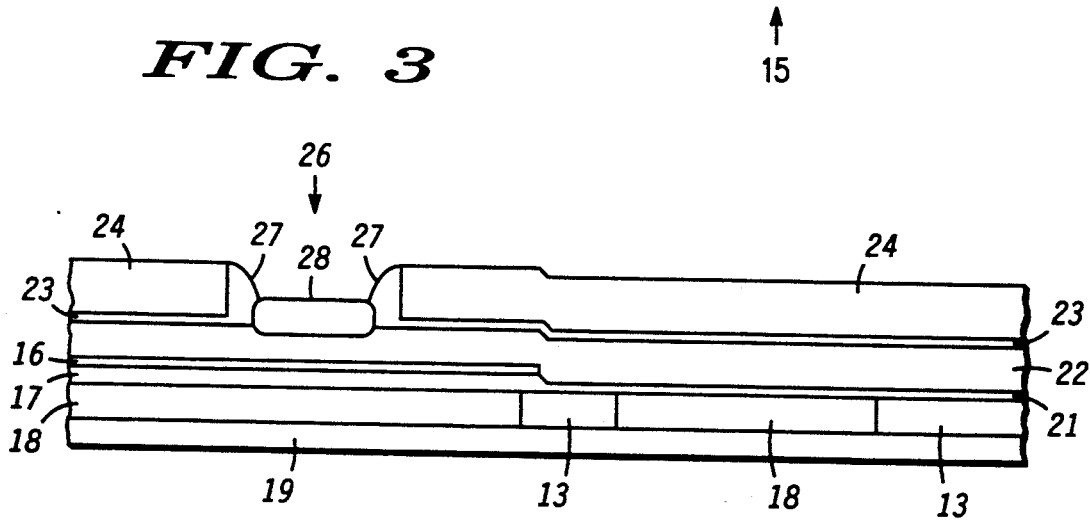
FIG. 4 shows the wafer of FIG. 3 after deposition of a nitride spacer.

FIG. 2 shows a CMOS device region 15 defined using photolithographic methods well known in the art. Nitride layer 16 and oxide layer 17 are removed from CMOS device region 15. FIG. 3 shows growth of a gate oxide layer 21. Since oxide does not form significantly over nitride layer 16, gate oxide layer 21 is essentially confined to CMOS device region 15. A first polycrystalline silicon layer 22 is then deposited over the entire wafer, followed by a nitride layer 23 and an oxide layer 24. An emitter opening 26 is formed by selective removal of nitride layer 23 and oxide layer 24. FIG. 4 shows deposition of a nitride spacer 27 at the edges of emitter opening 26. This is followed by growth of a hard mask oxide 28 over the remaining area of emitter opening 26. Hard mask oxide 28 is an oxide layer, typically grown silicon dioxide, used to protect underlying elements during a subsequent etch step. Nitride spacer 27 serves to provide a closely controlled annular separation between the edge of emitter opening 26 and hard mask oxide 28. In addition, nitride spacer 27 accurately centers hard mask oxide 28 within emitter opening 26.

Figure 5:
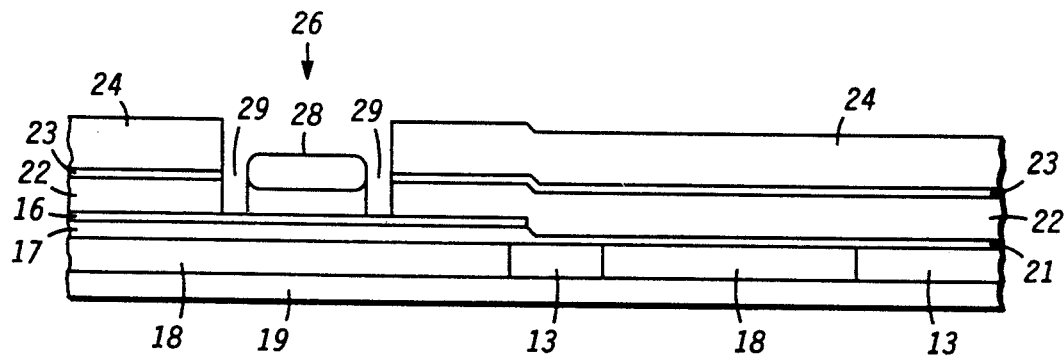
FIG. 5 shows the wafer of FIG. 4 after base openings are partially formed by an isotropic etch.

FIG. 5 shows a cross section of an annular base opening 29 formed by an isotropic etch which removes nitride spacer 27 (FIG. 4). The underlying portion of first polycrystalline silicon layer 22 is subsequently removed via anisotropic reactive ion etch (RIE). Due to the accurate alignment of hard mask oxide 28, annular base opening 29 is accurately aligned around the edges of emitter opening 26 with a precisely controlled width.

Figure 6:
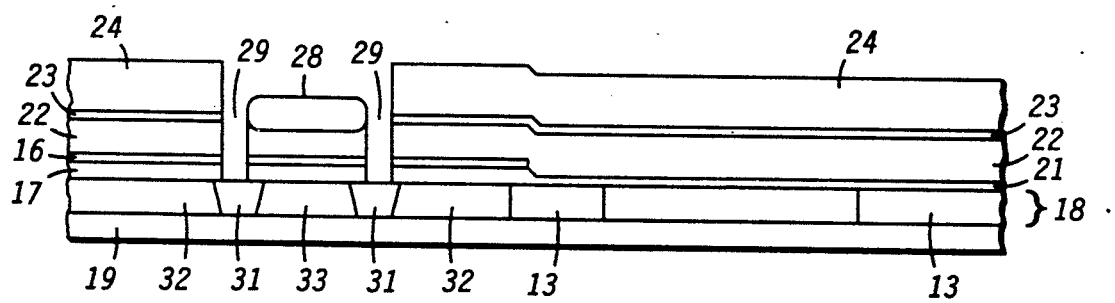
FIG. 6 shows the wafer of FIG. 5 after further etching has formed the base openings.
Figure 7:
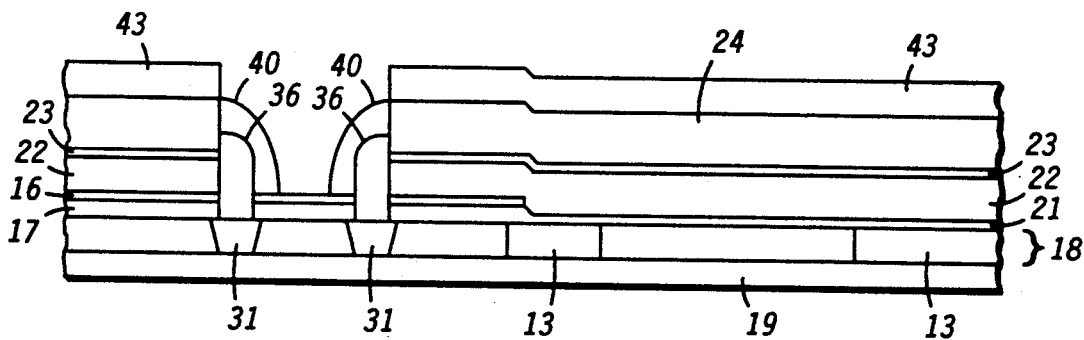
FIG. 7 shows the wafer of FIG. 6 after a polycrystalline spacer is deposited in the base openings.
Figure 8:
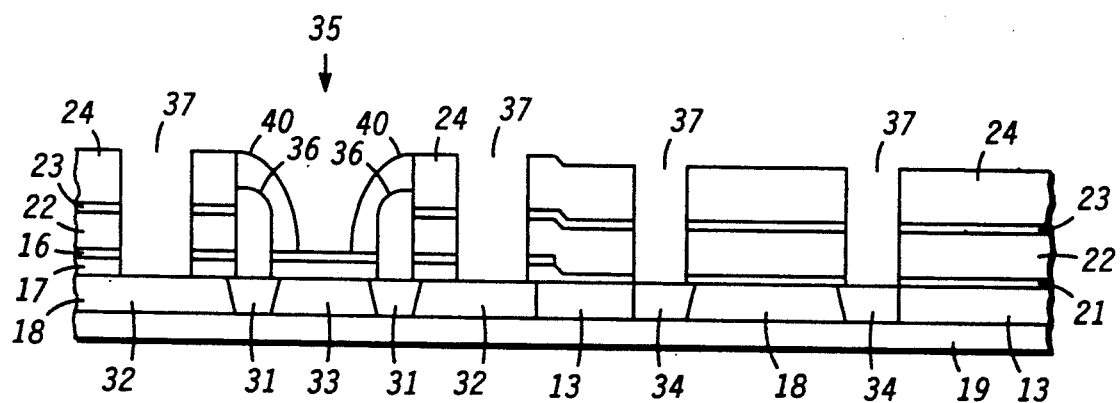
FIG. 8 shows the wafer of FIG. 7 after collector openings are formed.

In FIG. 6, further etching has removed the portions of nitride layer 16 and oxide layer 17 which were formerly beneath nitride spacer 27 (FIG. 4) exposing portions of thin film 18. An annular base area 31 is formed by doping through the entire depth of thin film 18. Annular base area 31 is formed as an annulus surrounding an emitter area 33. FIG. 6 thus shows only a cross section of annular base area 31. A collector area 32 surrounds annular base area 31. FIG. 7 shows a polycrystalline spacer 36 deposited in base opening 29 (FIG. 6). Polycrystalline spacer 36 is typically formed as part of a second polycrystalline silicon layer 43 deposited over oxide layer 24. Second polycrystalline silicon layer 43 is typically patterned and used as an added layer for interconnection in the same way as a metal layer. Alternative embodiments of the present invention remove second polycrystalline silicon layer 43 except for polycrystalline spacer 36. Hard mask oxide 28 and the underlying portion of first polycrystalline silicon layer 22 are then removed by etching. An oxide spacer 40 is then deposited over polycrystalline spacer 36. FIG. 8 shows a plurality of collector contact openings 37 etched to thin film 18. Collector contact openings 37 are also used to define a plurality of CMOS areas 34. CMOS areas 34 are then doped to the desired impurity concentration levels to form CMOS drain and source areas.

Figure 9:
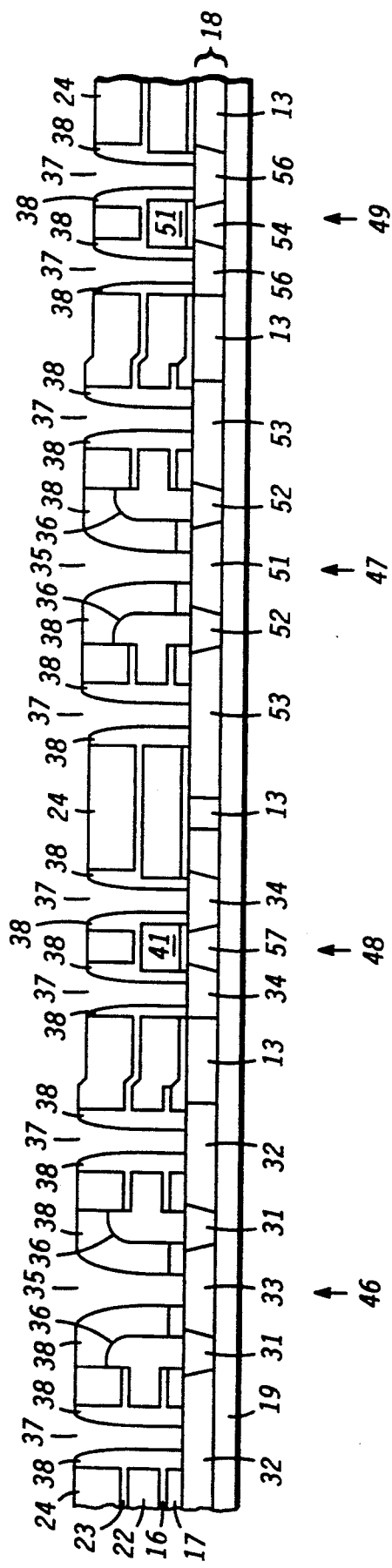
FIG. 9 shows a larger portion of the wafer of FIG. 8, which includes complementary transistor types, after a nitride spacer is deposited in the collector openings.

FIG. 9 shows collector contact openings 37 having a nitride spacer 38 which is deposited on the side walls of contact openings 37 as well as over oxide layer 24. Openings are formed through nitride spacer 38 to expose portions of thin film 18 so as to allow electrical connection to CMOS areas 34, and collector area 32. Further etching removes nitride layer 16 and oxide layer 17 from an opening 35 to expose emitter area 33. Similar openings (not shown) to first polycrystalline silicon layer 22 allow electrical connection to polycrystalline spacer 36 and to a gate 41. This connection to polycrystalline spacer 36 using a conductive layer such as first polycrystalline silicon layer 22 can be made very short and in turn makes electrical contact along the entire surface of base area 31. A short, continuous connection of this type inherently allows low base parasitics, ensuring that the bipolar transistor has optimal performance specifications. The bipolar transistors fabricated using this method minimize parasitic base resistance since contact is made to the entire base area. Additionally the portion of the semiconductor structure shown by FIG. 9 is expanded to show the structure of complementary transistor types fabricated by the preferred embodiment of the present invention. An NPN bipolar transistor 46 is formed using N doped material for emitter area 33, P doped material for base area 31 and N doped material for collector area 32. Similarly a PNP bipolar transistor 47 is formed from using P doped material for an emitter area 51, N doped material for a base area 52, and P doped material for a collector area 53. Likewise an N channel FET 48 is formed using a highly N doped material for CMOS areas 34 together with a P or N doped material for channel area 57. N channel FET 48 is controlled by a gate 41. A P channel FET 49 is formed using a highly P doped material for CMOS areas 56 together with a P or N doped material for channel area 54. P channel FET 49 is controlled by a gate 51. The corresponding areas comprising complementary transistors are similar in all respects except for doping type. All four complementary transistor types are fabricated using the same steps as shown in FIGS. 1-8 for the preferred embodiment.

Figure 10:
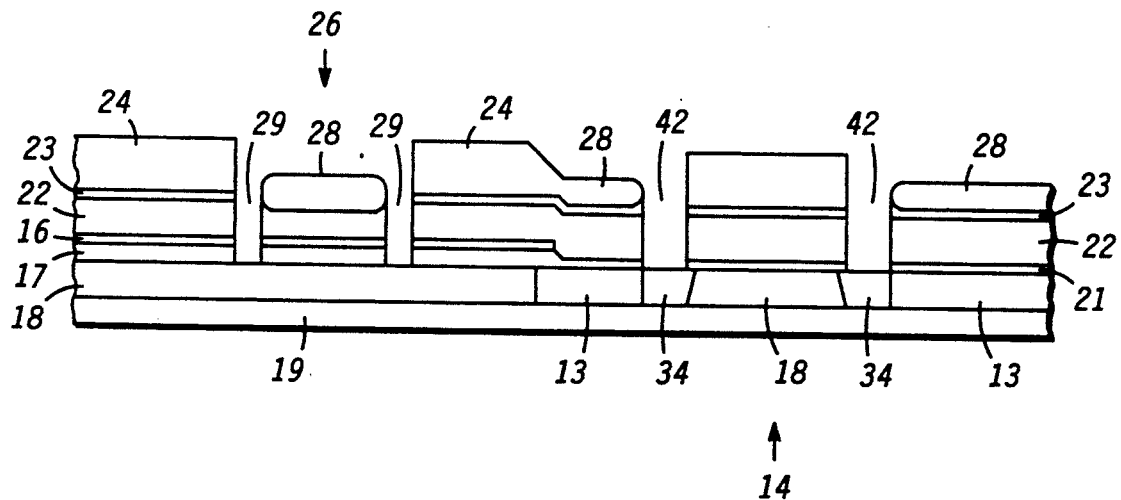
FIG. 10 shows the wafer of FIG. 6 as an alternative embodiment of the present invention wherein CMOS contact areas are defined by a hard mask oxide.
Figure 11:
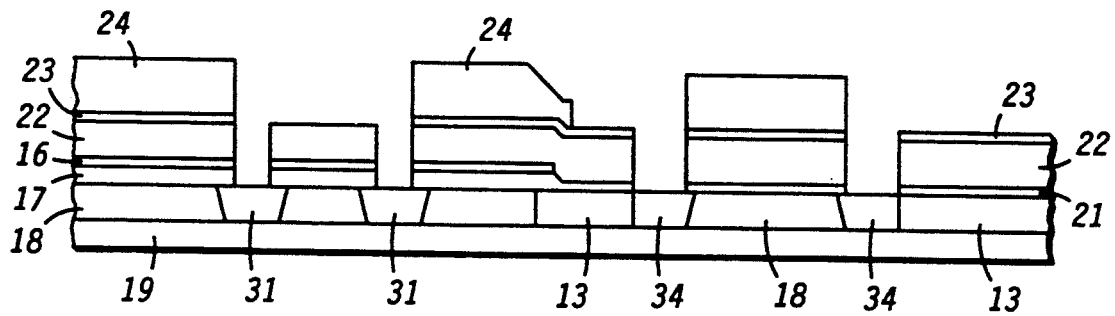
FIG. 11 shows the wafer of FIG. 10 after the hard mask oxide is removed.

FIGS. 10 and 11 show highly enlarged cross sectional views of a portion of a semiconductor structure which is an alternative embodiment of the present invention during various stages of processing. Starting wafer 14 is processed as shown in FIGS. 1-4, including definition of emitter opening 26 and hard mask oxide 28 (FIG. 4). In this embodiment a plurality of CMOS contact openings 42 are defined using additional areas of hard mask oxide 28 and emitter opening 26. The etches which remove nitride spacer 27 (FIG. 4) and the underlying portion of first polycrystalline silicon layer 22 to create base area 31 also create CMOS contact openings 42. CMOS contact openings 42 thus define CMOS areas 34 which are then doped to the desired impurity concentration levels to form CMOS drain and source areas. This embodiment does not use collector contact openings 37 to define CMOS related areas, but is otherwise similar to the preferred embodiment. FIG. 11 shows the bipolar and CMOS transistors after hard mask oxide 28 is removed. At this point the CMOS device fabrication is complete. The bipolar devices continue the fabrication steps as set forth above in FIGS. 7 to 9 for the preferred embodiment.

By now it should be clear that the present invention provides a method for fabricating both complementary bipolar and CMOS transistors on SOI. The method uses two layers of polycrystalline silicon and the transistor elements are inherently self aligned. The method provides bipolar transistors having especially low base parasitics due to the extremely short, direct base contact. Isolation between transistors is easily provided by use of dielectric isolation which inherently exhibits low leakage and low capacitance. The very thin film used as a starting wafer minimizes side encroachment giving tight control of structure size and allowing fabrication of extremely small devices. As a result of the very low parasitic resistances and capacitances the transistors are capable of achieving extremely high performance. The method uses the minimum of mask steps and integrates fabrication of both the bipolar and CMOS transistors into a single manufacturing flow requiring a minimum of extra steps devoted solely to one transistor type.

We claim:

1. A method for fabricating both complementary bipolar and CMOS on SOI, comprising:
providing a wafer which comprises a thin film of monocrystalline silicon above an oxide insulating layer;
forming a LOCOS lateral isolation through the thin film;
growing a first layer of oxide over the thin film;
further depositing a first layer of nitride over the layer of oxide;
defining a region where CMOS structures are desired;
removing the first layer of oxide and the first layer of nitride from the region where CMOS structures are desired;
growing a gate oxide over the region where CMOS structures are desired;
depositing a first polycrystalline silicon layer over the entire wafer;
depositing a second layer of nitride over the polycrystalline silicon;
depositing a second layer of oxide over the second layer of nitride;
defining an emitter area opening;
depositing a first nitride spacer in the emitter area opening;
growing a hard mask oxide layer to form a mask over the first polycrystalline silicon layer;
selectively removing the first nitride spacer, the second layer of nitride and the second layer of oxide to expose the polycrystalline silicon layer in the emitter area opening;
forming a slot in the first polycrystalline silicon layer, the second layer of nitride, and the second layer of oxide to the thin film so as to form a base area opening;
depositing a second polycrystalline silicon layer over the entire wafer;
forming a polycrystalline silicon spacer from the second polycrystalline silicon layer so as to fill the base area opening;
depositing a spacer of oxide over the polycrystalline silicon spacer;
forming a collector opening, a CMOS drain opening and a CMOS source opening; and
depositing a second nitride spacer on the side walls of the collector opening, the CMOS drain opening and the CMOS source opening.

2. A method for fabricating both complementary bipolar and CMOS on SOI, comprising:
providing a wafer which comprises a thin film of monocrystalline silicon above an oxide insulating layer;
covering the thin film with a first layer of oxide;
covering the first layer of oxide with a first layer of nitride;
defining a region where CMOS structures are desired;
removing the first layer of oxide and the first layer of nitride from the region where CMOS structures are desired;
providing a gate oxide over the region where CMOS structures are desired;
providing polycrystalline silicon over the entire wafer;
covering the polycrystalline silicon with a second layer of nitride;
covering the second layer of nitride with a second layer of oxide;
defining an emitter area opening and a plurality of CMOS areas;
providing a first nitride spacer in the emitter area opening;
selectively removing the second layer of nitride and the second layer of oxide to expose the polycrystalline silicon layer in the emitter area opening;
providing a hard mask oxide layer to form a mask over the polycrystalline silicon;
forming a slot in the polycrystalline silicon layer to the thin film so as to form a base area opening;
providing a polycrystalline silicon spacer which fills the base area opening;

covering the polycrystalline silicon spacer with a spacer of oxide;

forming a collector opening, a CMOS drain opening and a CMOS source opening; and providing a second nitride spacer on the side walls of the collector opening, the CMOS drain opening and the CMOS source opening.

3. The method for fabricating both complementary bipolar and CMOS on SOI of claim 2, further comprising:

forming a LOCOS lateral isolation through the thin film prior to growing the first layer of oxide over the thin film.

4. A method for fabricating both complementary bipolar and CMOS on SOI, comprising:

providing a wafer which comprises a thin film of monocrystalline silicon above a first insulating layer;

fabricating a second insulating layer over the thin film;

defining a region where CMOS structures are desired;

removing the second insulating layer from the region where CMOS structures are desired;

covering the region where CMOS structures are desired with a gate oxide;

forming a first layer of polycrystalline silicon over the entire wafer;

fabricating a third insulating layer over the layer of polycrystalline silicon;

opening an emitter area opening through the third insulating layer to the first polycrystalline silicon layer;

forming a first insulating spacer in the emitter area;

removing the third insulating layer to expose the polycrystalline silicon;

forming a mask layer over the first polycrystalline silicon layer;

removing a slot in the first polycrystalline silicon layer to the thin film;

building a polycrystalline silicon spacer to fill the slot;

forming an insulating spacer over the polycrystalline silicon spacer;

fabricating openings for a collector, a CMOS drain, and a CMOS source; and forming a second insulating spacer on the side walls of the openings for the collector, the CMOS drain and the CMOS source.

5. The method for fabricating both complementary bipolar and CMOS on SOI of claim 4, further comprising:

fabricating a lateral insulating region through the thin film to provide isolation between predetermined areas of the thin film.

6. The method for fabricating both complementary bipolar and CMOS on SOI of claim 5, wherein:

the lateral insulating region comprises a LOCOS isolation.

7. The method for fabricating both complementary bipolar and CMOS on SOI of claim 5, wherein:

the lateral insulating region comprises a mesa isolation.

8. The method for fabricating both complementary bipolar and CMOS on SOI of claim 4, wherein:

the first insulating layer comprises an oxide layer.

9. The method for fabricating both complementary bipolar and CMOS on SOI of claim 4, wherein:

the second insulating layer and the third insulating layer comprise a predetermined combination of oxide and nitride layers.

10. The method for fabricating both complementary bipolar and CMOS on SOI of claim 4, wherein:

the polycrystalline silicon spacer is formed from a second layer of polycrystalline silicon which is formed above the first layer of polycrystalline silicon.

* * * * *